United States Patent
Fan et al.

(10) Patent No.: US 6,800,948 B1
(45) Date of Patent: Oct. 5, 2004

(54) BALL GRID ARRAY PACKAGE

(75) Inventors: Chun Ho Fan, Sham Tseng (HK); Joseph Andrew Martin, Chandler, AZ (US); Ming Wang Sze, Tsuen Wan (HK); Tak Sang Yeung, Tin Shui Wai (HK)

(73) Assignee: ASAT Ltd., New Territories (HK)

( * ) Notice: Subject to any disclaimer, the term of this patent is extended or adjusted under 35 U.S.C. 154(b) by 0 days.

(21) Appl. No.: 10/197,832

(22) Filed: Jul. 19, 2002

(51) Int. Cl.$^7$ .......................... H01L 23/48; H01L 23/52
(52) U.S. Cl. ....................... 257/783; 257/712; 257/796; 257/693; 257/706
(58) Field of Search ............................ 257/783, 706, 257/712, 796, 693

(56) References Cited

U.S. PATENT DOCUMENTS

| | | | | |
|---|---|---|---|---|
| 4,698,662 A | * | 10/1987 | Young et al. | 257/777 |
| 5,172,213 A | * | 12/1992 | Zimmerman | 257/796 |
| 5,311,060 A | * | 5/1994 | Rostoker et al. | 257/796 |
| 5,339,216 A | * | 8/1994 | Lin et al. | 361/707 |
| 5,493,153 A | * | 2/1996 | Arikawa et al. | 257/796 |
| 5,610,442 A | * | 3/1997 | Schneider et al. | 257/787 |
| 5,639,694 A | * | 6/1997 | Diffenderfer et al. | 257/676 |
| 5,650,663 A | * | 7/1997 | Parthasarathi | 257/706 |
| 5,679,978 A | * | 10/1997 | Kawahara et al. | 257/697 |
| 5,705,851 A | * | 1/1998 | Mostafazadeh et al. | 257/675 |
| 5,977,626 A | | 11/1999 | Wang et al. | 257/707 |
| 5,986,885 A | * | 11/1999 | Wyland | 361/704 |
| 6,037,658 A | | 3/2000 | Brodsky et al. | |
| 6,236,568 B1 | * | 5/2001 | Lai et al. | 361/704 |
| 6,251,706 B1 | * | 6/2001 | Paniccia | 438/122 |
| 6,323,066 B2 | | 11/2001 | Lai et al. | |
| 6,414,385 B1 | * | 7/2002 | Huang et al. | 257/690 |
| 6,462,405 B1 | | 10/2002 | Lai et al. | |
| 6,525,421 B1 | * | 2/2003 | Chia et al. | 257/730 |
| 6,631,078 B2 | | 10/2003 | Alcoe et al. | |
| 2001/0015492 A1 | | 8/2001 | Akram et al. | |
| 2002/0005578 A1 | | 1/2002 | Kodama et al. | |
| 2002/0006718 A1 | * | 1/2002 | DisTefano | 438/617 |
| 2002/0185734 A1 | * | 12/2002 | Zhao et al. | 257/737 |
| 2003/0034569 A1 | * | 2/2003 | Caletka et al. | 257/796 |

FOREIGN PATENT DOCUMENTS

| | | | | |
|---|---|---|---|---|
| DE | 100 15 962 A1 | | 10/2001 | |
| JP | 2-278783 | * | 11/1990 | 372/36 |
| JP | 9-232690 | * | 9/1997 | H01S/003/18 |

OTHER PUBLICATIONS

U.S. patent application Ser. No. 10/647,696, Mohan Kirloskar et al., "Improved Ball Grid Array Package and Process For Manufacturing Same", filing date: Aug. 25, 2003.

U.S. patent application Ser. No. 10/323,657, Chun Ho Fan et al., "Process For Manufacturing Ball Grid Array Package", filing date: Dec. 20, 2002.

U.S. patent application Ser. No. 10/372,421, Joseph Andrew Martin et al., "Improved Ball Grid Array Package", filing date: Feb. 24, 2003.

U.S. patent application Ser. No. 10/643,961, Chun Ho Fan et al., "Improved Ball Grid Array Package and Process For Manufacturing Same", filing date: Aug. 20, 2003.

* cited by examiner

*Primary Examiner*—Jasmine Clark
(74) *Attorney, Agent, or Firm*—Keating & Bennett, LLP

(57) ABSTRACT

An integrated circuit package including a substrate having opposing first and second surfaces. The substrate has conductive traces disposed therein. A semiconductor die is mounted on the first surface of the substrate and a silicon heat sink disposed on a portion of the semiconductor die. A plurality of wire bonds connect the semiconductor die to the conductive traces of the substrate and an overmold material covers the first surface of the substrate and a remainder of the semiconductor die. A ball grid array is disposed on the second surface of the substrate. Bumps of the ball grid array are in electrical connection with the conductive traces.

6 Claims, 2 Drawing Sheets

BALL GRID ARRAY PACKAGE

FIELD OF THE INVENTION

This invention relates in general to integrated circuit packaging, and In particular to an improved ball grid array package with improved thermal characteristics.

BACKGROUND OF THE INVENTION

High performance integrated circuit (IC) packages are well known in the art. Improvements in IC packages are driven by industry demands for increased thermal and electrical performance, decreased size and cost of manufacture.

In general, array packaging such as Plastic Ball Grid Array (PBGA) packages provide a high density of interconnects relative to the surface area of the package. However typical PBGA packages include a convoluted signal path, giving rise to high impedance and an inefficient thermal path which results in low thermal dissipation performance. With increasing package density, the spreading d heat generated by the device is increasingly important.

Reference is made to FIG. 1 which shows an elevation view of a portion of a conventional fine pitch BGA (fpBGA) package indicated generally by the numeral 20. The fpBGA package 20 includes a substrate 22 and a semiconductor die 24 attached to the substrate 22 by a die adhesive. Gold wire bonds electrically connect the die 24 to metal traces on the substrate 22. The wire bonds and die 24 are encapsulated in a molding compound 26. Solder balls 28 are disposed on the bottom surface of the substrate 22 for signal transfer. Because of the absence of a thermal path away from the semiconductor die, thermal dissipation in this package is very poor.

One method of improving heat dissipation is the addition of thermal vias in the substrate. The thermal vias connect the die 24 to some of the solder balls 28 for heat dissipation. The thermal vias are small and heat dissipation in high density packages is still poor.

Variations to conventional BGA packages have been proposed for the purpose of increasing thermal and electrical performance. FIG. 2 shows an elevation view of a portion of a fpBGA package of the prior art with a heat sink 30. The heat sink 30 is comprised of a metal plate added to the upper portion of the package 20 for dissipating heat from the package 20. This package still suffers disadvantages, however, as heat must be dissipated from the silicon die 24, first through the molding compound 26 and then through the heat sink 30. Thus, heat dissipation away from the silicon die 24 in high density packages is still poor.

Another example of a variation to conventional BGA packages is described in U.S. Pat. No. 5,977,626, issued Nov. 2, 1999, the contents of which are incorporated herein by reference. The '626 patent discloses a PBGA package having a metal heat spreader in contact with an upper surface of the semiconductor die and ground pads on the substrate. The heat spreader is added to dissipate heat from the semiconductor die to the surrounding environment. These packages also suffer disadvantages, however. One particular disadvantage is that the heat spreader and semiconductor die have significantly different thermo-mechanical properties causing induced stress on the semiconductor die during thermal cycling.

It is therefore an object of an aspect of the present invention to provide a BGA package with enhanced thermal properties.

SUMMARY OF THE INVENTION

According to an aspect of the present invention, there is provided an integrated circuit package including a substrate having opposing first and second surfaces. The substrate has conductive traces disposed therein. A semiconductor die is mounted on the first surface of the substrate and a silicon heat sink is disposed on a portion of the semiconductor die. A plurality of wire bonds connect the semiconductor die to the conductive traces of the substrate and an overmold material covers the first surface of the substrate and a remainder of the semiconductor die. A ball grid array is disposed on the second surface of the substrate. Bumps of the ball grid array are in electrical connection with the conductive traces.

According to another aspect of the present invention, there is provided a process for fabricating an integrated circuit The process includes: mounting a semiconductor die to a first surface of a substrate; wire bonding the semiconductor die to conductive traces of the substrate; mounting a silicon heat sink on a portion of the semiconductor die; covering the substrate and a remainder of the semiconductor die with an overmold material; and forming a ball grid array on a second surface of the substrate. The first surface opposes the second surface. Bumps of the ball grid array are electrically connected to the conductive traces.

According to yet another aspect of the present invention, there is provided a process for fabricating an integrated circuit. The process includes: mounting a semiconductor die to a first surface of a substrate; wire bonding the semiconductor die to conductive traces of the substrate; mounting a collapsible structure on a portion of the semiconductor die; mounting a silicon heat sink on the collapsible structure; covering the substrate and a remainder of the semiconductor die with an overmold material; and forming a ball grid array on a second surface of the substrate. The first surface opposes the second surface. Bumps of the ball grid array are electrically connected to the conductive traces.

Advantageously, the silicon heat sink has substantially the same thermo-mechanical properties as the semiconductor die. Thus the coefficient of thermal expansion (CTE) and the elastic modulus of the silicon heat sink are substantially identical to the CTE and elastic modulus, respectively, of the semiconductor die. Also, blank silicon rejects can be used from production, thereby providing an inexpensive heat sink. In a further advantage, the silicon heat sink is mounted on the semiconductor die by a compliant adhesive or by a collapsible structure to inhibit induced stress on the die during molding and to inhibit cracking or damaging the semiconductor die. This structure permits a lack of mold flash on top of the exposed silicon heat sink.

In one aspect, the present invention provides a silicon heat sink mounted on the semiconductor die and having a surface exposed through the molding compound. Thus, a direct thermal path is provided from the semiconductor die to the environment

BRIEF DESCRIPTION OF THE DRAWINGS

The invention will be better understood with reference to the drawings, and the following description in which.

DETAILED DESCRIPTION OF THE PREFERRED EMBODIMENTS

Figure 1:
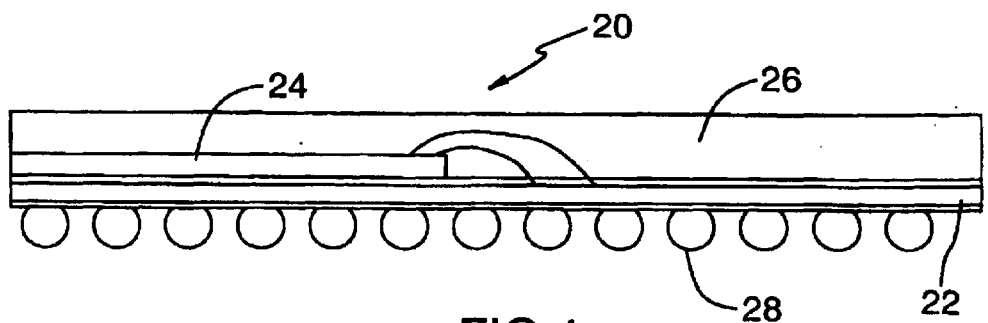
FIG. 1 shows an elevation view of a portion of a conventional fine pitch ball grid array package.
Figure 2:
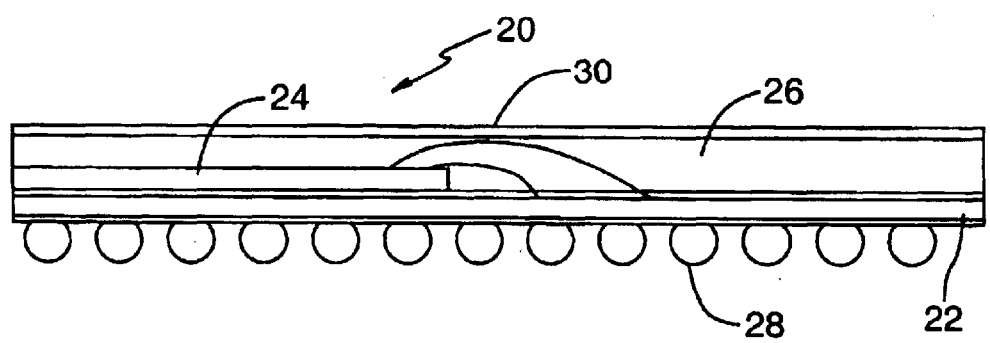
FIG. 2 shows an elevation view of a portion of a fine pitch ball grid array with a heat sink, according to the prior art

To simplify the description, the numerals used previously in describing FIGS. 1 and 2 will be used again after raising the numerals by 100 where the parts to be described correspond to parts described herein above.

Figure 3:
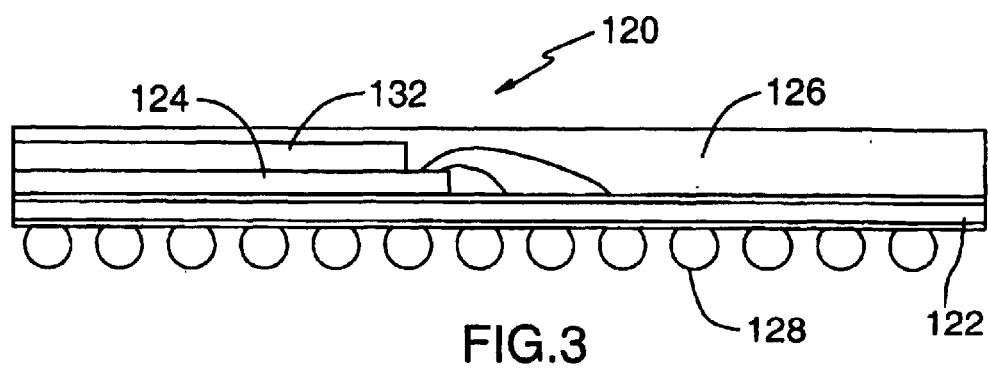
FIG. 3 shows an elevation vies of a portion of an improved fine pitch ball grid array package according to an embodiment of the present invention.

Reference is now made to FIG. 3 which shows an improved fine pitch ball grid array package according to an embodiment of the present invention, indicated generally by the numeral 120. The package 120 includes a substrate 122 that includes a plurality of conductive traces (not shown) for providing conductive paths for signal transfer. In the present embodiment, the substrate is polyimide with gold conductive traces. Other substrate materials and conductive metal or alloy traces will occur to those skilled in the art.

A singulated semiconductor die 124 is conventionally mounted to a first, or upper surface of the substrate 122 using a die attach material such as a die adhesive. The semiconductor die has a conductive pad array formed thereon and gold wires are bonded between the conductive pads of the array and the conductive traces on the substrate 122 using conventional wire bonding techniques.

A silicon adapter, or silicon heat sink 132 is mounted to the top of the semiconductor die 124 to provide a thermal path away from the die 124. The thermo-mechanical properties of the silicon heat sink 132 are substantially identical to the thermo-mechanical properties of the silicon semiconductor die 124. In the present embodiment, a compliant adhesive is used between the die 124 and the heat sink 132 to adhere the heat sink 132 to the die 124.

Next the package is encapsulated in an overmold compound 126. The encapsulation material protects the wire bonds as well as the semiconductor die 124. The wire bonds are thereby electrically Isolated by the encapsulating material. As shown in FIG. 3, the overmold compound also encapsulates and covers the silicon heat sink 132.

A fine pitch ball grid array (fpBGA) of solder balls 128, also referred to as solder bumps, is formed on the second surface, or bottom surface of the substrate 122 by conventional positioning. To attach the solder balls 128, a flux is added to the balls prior to placement and, after placement, the solder balls 128 are reflowed using known reflow techniques. The solder balls 128 are thereby connected to the conductive traces of the substrate 122 and through the gold wires, to the semiconductor die 124. The solder balls 128 provide signal and power connections as well as ground connections for the semiconductor die 124.

Figure 4:
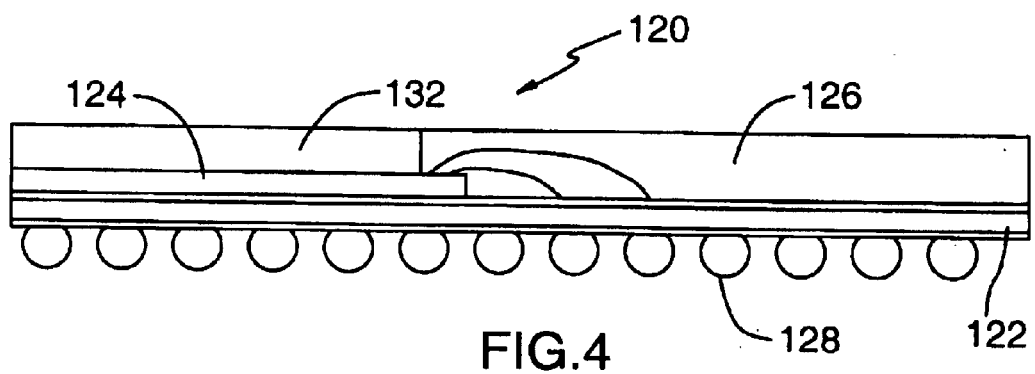
FIG. 4 shows an elevation view of a portion of an improved fine pitch ball grid array package according to another embodiment of the present invention.

Reference is now made to FIG. 4 to describe a fpBGA package according to another embodiment of the present invention. The fpBGA package of the present embodiment is similar to that of the above-described embodiment, except that the silicon heat sink 132 in the present embodiment is not encapsulated in the overmold compound. The overmold compound surrounds the silicon heat sink but does not cover it. Instead, the silicon heat sink 132 is exposed at the top of the package to provide a direct thermal path from the silicon die 124 to the exterior surface of the package 120.

Figure 5A:
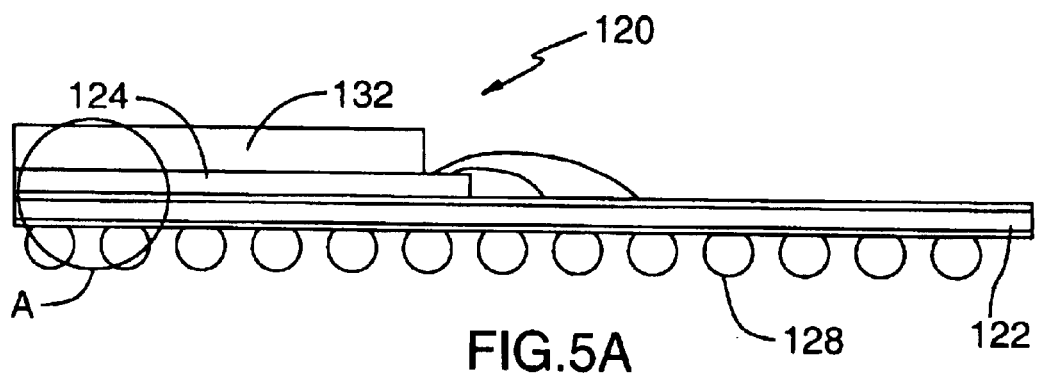
FIGS. 5A and 5B show an elevation view of a portion of an alternative embodiment of an improved fine pitch ball grid array package having a collapsible structure inserted between a semiconductor die and a silicon heat sink, prior to overmolding.
Figure 5B:
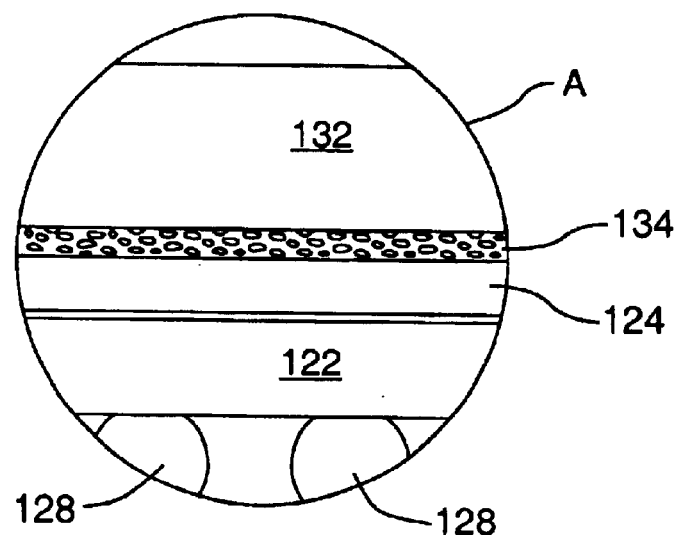

Reference is made to FIGS. 5A and 5B which show a portion of the fpBGA package according to an alternative embodiment of the present invention. In this embodiment a collapsible structure 134, such as metallic foam, is inserted between the die 124 and the silicon heat sink 132, rather than using a compliant adhesive. The collapsible structure 134 is epoxy attached to the semiconductor die and the silicon heat sink 132 is epoxy attached to the collapsible structure 134. During overmolding, the top plate of the mold apples a compressive force on the silicon heat sink 132, thereby collapsing the collapsible structure 134. Thus, the collapsible structure 134 collapses to take up the stress induced during overmolding and thereby inhibit undue stresses on the semiconductor die 124.

Specific embodiments of the present invention have been shown and described herein. However, modifications and variations to these embodiments are possible. For example, the substrate can be polyimide, as described, or can be phenolic resin, bismaleimidetriazine (BT), or other suitable material. Similarly, the conductive traces can be copper or other conductive metal or alloy. Those skilled in the art may conceive of still other modifications and variations, all of which are within the scope and sphere of the present invention.

What is claimed is:

1. An integrated circuit package comprising:

a substrate having opposing first and second surfaces, said substrate having conductive traces disposed therein;

a semiconductor die mounted on said first surface of said substrate;

a silicon heat sink mounted on a first portion of said semiconductor die via a compliant adhesive;

a plurality of wire bonds connecting said semiconductor die to said conductive traces of said substrate;

an overmold material covering said first surface of said substrate and a remaining portion of said semiconductor die such that an upper surface of the silicon heat sink is exposed; and a ball grid array disposed on said second surface of said substrate, bumps of said ball grid array being in electrical connection with said conductive traces;

wherein the silicon heat sink and the semiconductor die have similar coefficients of thermal expansion.

2. The integrated circuit package according to claim 1 wherein said overmold material surrounds said silicon heat sink.

3. An integrated circuit package comprising:

a substrate having opposing first and second surfaces, said substrate having conductive traces disposed therein;

as miconductor die mounted on said first surface of said substrate;

a silicon heat sink disposed on a first portion of said semiconductor die;

a plurality of wire bonds connecting said semiconductor die to said conductive traces of said substrate;

an overmold material covering said first surface of said substrate and a remaining portion of said semiconductor die;

a ball grid array disposed on said second surface of said substrate, bumps of said ball grid array being in electrical connection with said conductive traces; and a collapsible structure disposed between said semiconductor die and said silicon heat sink such that said silicon heat sink is mounted to said collapsible structure and said collapsible structure is mounted to said portion of said semiconductor die;

wherein the silicon heat sink and the semiconductor die have similar coefficients of thermal expansion.

4. The integrated circuit package according to claim 3, wherein an upper surface of said silicon heat sink is exposed.

5. The integrated circuit package according to claim 4, wherein said overmold material surrounds said silicon heat sink.

6. An integrated circuit package comprising:

a substrate having opposing first and second surfaces, said substrate having conductive traces disposed therein;

a semiconductor die mounted on said first surface of said substrate;

a silicon heat sink disposed on a first portion of said semiconductor die;

a plurality of wire bonds connecting said semiconductor die to said conductive traces of said substrate;

an overmold material covering said first surface of said substrate and a remaining portion of said semiconductor die;

a ball arid array disposed on said second surface of said substrate, bumps of said ball grid array being in electrical connection with said conductive traces; and a collapsible structure disposed between said semiconductor die and said silicon heat sink such that said silicon heat sink is mounted to said collapsible structure and said collapsible structure is mounted to said portion of said semiconductor die;

wherein said collapsible structure comprises metallic foam.

* * * * *